(12) United States Patent
Park et al.

(10) Patent No.: US 7,431,628 B2
(45) Date of Patent: Oct. 7, 2008

(54) METHOD OF MANUFACTURING FLAT PANEL DISPLAY DEVICE, FLAT PANEL DISPLAY DEVICE, AND PANEL OF FLAT PANEL DISPLAY DEVICE

(75) Inventors: Jin-Woo Park, Suwon-si (KR); Dong-Soo Choi, Suwon-si (KR); Seung-Yong Song, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 19 days.

(21) Appl. No.: 11/282,210

(22) Filed: Nov. 18, 2005

(65) Prior Publication Data

US 2007/0114909 A1     May 24, 2007

(51) Int. Cl.
*H01J 9/26*     (2006.01)
(52) U.S. Cl. .............................. 445/25; 445/24; 445/44
(58) Field of Classification Search ......... 313/495–512; 445/23–26
See application file for complete search history.

(56) References Cited

U.S. PATENT DOCUMENTS

| | | | | |
|---|---|---|---|---|
| 4,037,930 | A | * | 7/1977 | Matsuyama et al. .......... 349/154 |
| 4,455,774 | A | * | 6/1984 | Watanabe .................... 40/451 |
| 5,600,203 | A | * | 2/1997 | Namikawa et al. .......... 313/495 |
| 5,614,353 | A | * | 3/1997 | Kumar et al. ................ 430/313 |
| 5,747,927 | A | * | 5/1998 | Namikawa et al. .......... 313/495 |
| 5,882,761 | A | | 3/1999 | Kawami et al. |
| 6,470,594 | B1 | * | 10/2002 | Boroson et al. ............... 34/335 |
| 6,603,254 | B1 | * | 8/2003 | Ando .......................... 313/495 |
| 6,605,893 | B2 | * | 8/2003 | Ando .......................... 313/495 |
| 6,791,660 | B1 | * | 9/2004 | Hayashi et al. .............. 349/190 |
| 6,859,255 | B2 | * | 2/2005 | Liao et al. .................... 349/190 |
| 6,878,467 | B2 | * | 4/2005 | Chung et al. ................. 428/690 |

(Continued)

FOREIGN PATENT DOCUMENTS

JP          5-335080           12/1993

(Continued)

OTHER PUBLICATIONS

Notice to Submit Response issued on Mar. 29, 2006 by Korean Intellectual Property Office.

*Primary Examiner*—Mariceli Santiago
*Assistant Examiner*—Jose M Diaz
(74) *Attorney, Agent, or Firm*—Knobbe Martens Olson & Bear LLP

(57) ABSTRACT

A flat panel display device, a panel of a flat panel display device, and a method of manufacturing a flat panel display device, in which a sealing effect and a resistance to a pressure are increased, and sealing is performed using a glass frit are disclosed. In one aspect, the method includes forming at least a light emitting unit on a surface of a substrate, the light emitting unit including a plurality of light emitting elements, preparing a sealing member to be placed opposite the surface of the substrate, applying a glass frit to an opposing surface of either the substrate or the sealing member to be disposed around the light emitting unit, applying a sealant to the opposing surface of either the substrate or the sealing member to enclose the glass frit, combining the substrate and the sealing member via the sealant, and combining the substrate and the sealing member via the glass frit.

20 Claims, 4 Drawing Sheets

U.S. PATENT DOCUMENTS

| | | | |
|---|---|---|---|
| 6,998,776 B2 * | 2/2006 | Aitken et al. | 313/512 |
| 7,019,461 B2 * | 3/2006 | Harada | 313/586 |
| 2003/0066311 A1 * | 4/2003 | Li et al. | 65/43 |
| 2003/0209983 A1 * | 11/2003 | Harada | 313/586 |
| 2004/0069017 A1 * | 4/2004 | Li et al. | 65/43 |
| 2004/0105065 A1 * | 6/2004 | Jung et al. | 349/153 |
| 2005/0001545 A1 * | 1/2005 | Aitken et al. | 313/512 |
| 2005/0110404 A1 * | 5/2005 | Park et al. | 313/512 |
| 2005/0174039 A1 * | 8/2005 | Nishikawa et al. | 313/495 |
| 2006/0084348 A1 * | 4/2006 | Becken et al. | 445/25 |
| 2006/0087230 A1 * | 4/2006 | Ghosh et al. | 313/512 |
| 2006/0103301 A1 * | 5/2006 | Spencer et al. | 313/512 |
| 2006/0279208 A1 * | 12/2006 | Hwang | 313/506 |
| 2006/0284556 A1 * | 12/2006 | Tremel et al. | 313/512 |
| 2007/0024171 A1 * | 2/2007 | Kawaguchi et al. | 313/292 |
| 2007/0164672 A1 * | 7/2007 | Omura et al. | 313/512 |

FOREIGN PATENT DOCUMENTS

| | | |
|---|---|---|
| JP | 08293245 A * | 11/1996 |
| JP | 2002-280169 | 9/2002 |
| JP | 2003-123966 | 4/2003 |
| JP | 2003-243160 | 8/2003 |
| JP | 2003243160 A * | 8/2003 |
| JP | 2005-209631 | 8/2004 |
| JP | 2004-296308 | 10/2004 |
| JP | 2004-319103 | 11/2004 |

\* cited by examiner

METHOD OF MANUFACTURING FLAT PANEL DISPLAY DEVICE, FLAT PANEL DISPLAY DEVICE, AND PANEL OF FLAT PANEL DISPLAY DEVICE

BACKGROUND OF THE INVENTION

1. Field of the Invention

The present invention relates to a flat panel display device, and more particularly, to a method of manufacturing a flat panel display device with an enhanced sealing structure.

2. Description of the Related Technology

In general, flat panel display devices such as organic light emitting panel display devices and TFT-LCDs can be made thin and flexible, and thus, many studies are being conducted in the related technology.

Organic light emitting display devices deteriorate as moisture penetrates within, so that a sealing structure for preventing penetration of moisture is required.

Conventionally, a metal can or a glass substrate has been used as a sealing member of OLED elements. The metal can or glass substrate may contain desiccant powder for absorbing moisture from the OLED elements once it is sealed. Alternatively, a desiccant film may be attached using, e.g., a double-sided tape as the sealing member. In either case, the sealing member is combined with a substrate, on which a light emitting element is formed, using a UV hardening sealant or a thermosetting sealant.

However, the use of a desiccant powder complicates the manufacturing process of flat panel display devices, increases the material and manufacturing costs, and increases the thickness of the substrate. Furthermore, due to the area being filled with the desiccant powder, front emission or double-sided emission may not be achievable, particularly when the sealing member comprises a non-transparent substrate.

U.S. Pat. No. 5,882,761 discloses an organic light emitting display apparatus including a stack of a pair of opposing electrodes with an emissive layer made of an organic compound, a container sealing the stack from external air, and a desiccant placed inside the container, wherein the desiccant remains in a solid state even after absorbing moisture. This patent suggests use of alkali metal oxide, sulfate, etc., as the desiccant.

When a desiccant film is used as the sealing member, there is a limit in preventing penetration of moisture, and the desiccant film may be damaged during manufacture or during use of the sealing member. Thus, the durability and reliability of the desiccant film are not sufficiently high, and therefore, the use of desiccant film is not suitable for mass-production.

Japanese Patent Laid-open Publication No. 5-335080 discloses a method of forming a protective layer in a thin, organic light emitting display including an emissive layer containing at least one kind of an organic compound between an anode and a cathode, at least one of which is transparent, the protective layer being made of amorphous silica.

A sealant for combining a sealing member with a substrate has a low resistance to pressure, and its resistance to moisture penetration is lowered, thereby degrading a sealing effect.

Due to the problems discussed above, glass frit with a high resistance to pressure and a good sealing characteristic has been suggested for use as a sealant. However, the glass frit needs to be softened by laser melting However, a laser scanning device for softening cannot be disposed under a nitrogen or vacuum atmosphere for sealing, and thus the glass frit cannot be practically exploited.

SUMMARY OF CERTAIN INVENTIVE ASPECTS

Aspects of the present invention include a flat panel display device, a panel of a flat panel display device and a method of manufacturing a flat panel display device, in which a sealing effect and a resistance to pressure at an adhesion portion between a substrate and a sealing member are increased.

Other aspects include a flat panel display device, a panel of a flat panel display device, and a method of manufacturing a flat panel display device, in which flat panel display device is sealed using glass frit.

According to an aspect of the present invention, there is provided a method of manufacturing a flat panel display device, the method comprising: forming at least a light emitting unit on a surface of a substrate, the light emitting unit including a plurality of light emitting elements; preparing a sealing member to be placed opposite to the surface of the substrate, applying at least one glass frit to an opposing surface of either the substrate or the sealing member to be disposed around the light emitting unit, applying a sealant to the opposing surface of either the substrate or the sealing member to enclose the glass frit, combining the substrate and the sealing member via the sealant, and combining the substrate and the sealing member via the glass frit.

According to another aspect of the present invention, there is provided a method of manufacturing a flat panel display device, the method comprising: forming at least a light emitting unit on a surface of a substrate, the light emitting unit including a plurality of light emitting elements, preparing a sealing member to be placed opposite to the surface of the substrate, applying a glass frit to an opposing surface of either the substrate or the sealing member to be disposed around the light emitting unit, applying a sealant to the opposing surface of either the substrate or the sealing member to enclose the glass frit, combining the substrate and the sealing member via the sealant under a nitrogen gas atmosphere, and combining the substrate and the sealing member via the glass frit under atmospheric pressure.

According to yet another aspect of the present invention, there is provided a flat panel display device that includes a substrate, a sealing member which is opposite to the substrate and sealed together with the substrate, and a light emitting unit which includes a plurality of light emitting elements and is disposed between the substrate and the sealing member, wherein the substrate and the sealing member are sealed by a glass frit provided to enclose the light emitting unit and the pressure of a space formed between the substrate and the sealing member is lower than atmospheric pressure.

According to still another aspect of the present invention, there is provided a panel of a flat panel display device, the panel including a substrate, a sealing member which is opposite to the substrate and sealed together with the substrate, and a plurality of light emitting units disposed between the substrate and the sealing member, each of the light emitting units including a plurality of light emitting elements, wherein the substrate and the sealing member are sealed by glass frits disposed to enclose the light emitting units and the pressure of a space formed between the substrate and the sealing member is lower than atmospheric pressure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

Figure 1A:
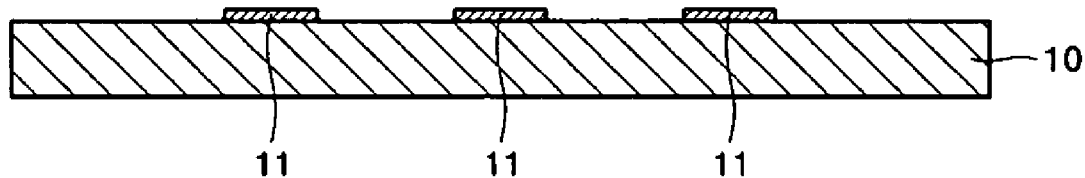
FIGS. 1A through 1F are cross-sectional diagrams illustrating certain steps of a method of manufacturing a flat panel display device, according to an embodiment of the present invention.

FIGS. 1A through 1F are cross-sectional diagrams illustrating certain steps of a method of manufacturing a flat panel display device, according to one embodiment. Referring to FIG. 1A, a plurality of light emitting units 11 are formed on a surface of a substrate 10. The substrate 10 may be made of a transparent glass material, but is not limited thereto, and may also be made of a plastic or a metal material.

Each of the light emitting units 11 comprises a plurality of light emitting elements. The light emitting unit may be an organic light emitting unit comprised of a plurality of organic light emitting elements in another embodiment.

If the light emitting units 11 are organic light emitting units, each of the organic light emitting units includes a pair of opposing electrodes and an organic layer which has at least an organic emissive layer and is disposed between the electrodes. The light emitting unit 11 may be either a passive matrix type or an active matrix type.

The light emitting unit 11 includes an anode acting as a hole source and a cathode acting as an electron source, which are disposed opposite to each other, and an organic emissive layer. The anode, the organic emissive layer, and the cathode are sequentially formed on the substrate 11. This structure of the light emitting unit 11 is for illustrative purposes, and does not limit the scope of the present invention. Alternatively, the positions of the anode and the cathode may be switched.

In a bottom emission type display, in which an image is displayed on the substrate 10, the anode may be made of a transparent electrode, and the cathode may be made of a reflective material. In a top emission type display, in which an image is displayed on the sealing member 20 opposite to the substrate 10, the anode may be made of a reflective material, and the cathode may be made of a transparent material.

Each of the anode and the cathode may be formed in a predetermined pattern. In an active matrix type display, the cathode may be formed as a whole layer using deposition and may also be formed in a predetermined pattern.

A low molecular weight organic layer or a polymer organic layer may be formed as the organic layer interposed between the anode and the cathode. Alternatively, when a low molecular weight organic layer is used, it may be formed as a hole injection layer (HIL), a hole transport layer (HTL), an organic emission layer (EML), an electron injection layer (EIL), or an electron transport layer (ETL), having a single layered structure or a stacked composite structure. Various organic materials, for example, copper phthalocyanine (CuPc), (N,N'-di (naphthalene-1-yl)-N,N'-diphenyl-benzidine (NPB), and tris-8-hydroxyquinoline aluminum (Alq3), may be used. The low molecular weight organic layer may be formed using vacuum deposition.

When a polymer organic layer is used, it may include a HTL and an EML. In this case, the HTL is made of PEDOT, and the EML is made of a high molecular weight organic material, such as polyphenylenevinylenes (PPVs) or polyflorenes. The high molecular weight organic layer may be formed using screen printing or inkjet printing.

At least the organic emissive layer may include red (R), green (G), and blue (B) patterns corresponding to pixels to implement full color display.

In the light emitting unit 11, when an anode voltage is applied to the anode and a cathode voltage is applied to the cathode, holes injected from the anode migrate into the emissive layer, and electrons migrate from the cathode into the emissive layer so that exitons are generated by a combination of the holes and the electrons in the emissive layer. As the exitons transition from an excited state to a base state, fluorescent molecules in the emissive layer emit light, thereby forming images. A full-color organic light emitting display device includes R, G, B pixels to implement full color display.

In addition, an insulating protective layer (not shown), which can planarize a top surface of the light emitting unit 11, may be formed on an upper electrode of the light emitting unit 11 to provide resistance to heat, chemicals, and moisture intrusion. The protective layer may be made of a metal oxide or a metal nitride.

Figure 1B:
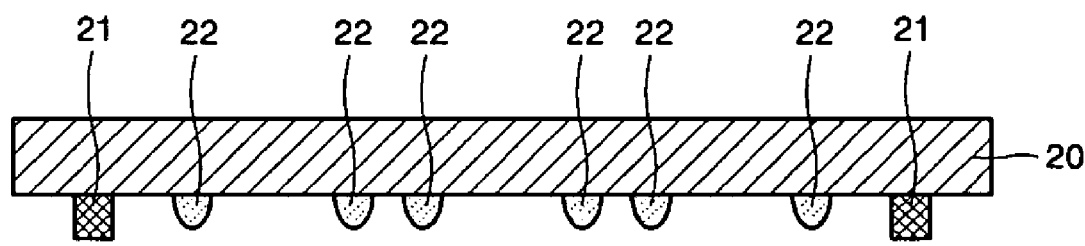

After the light emitting unit 11 is formed, a sealing member 20, as shown in FIG. 1B, is formed to face a surface of the substrate 10 on which the light emitting units 11 are formed. The sealing member 20 may be made of glass, but is not limited thereto, and may be made of a plastic material or a metal.

Glass frits 22 and a sealant 21 are applied to a surface of the sealing member 20 opposite to the substrate 10.

Figure 2:
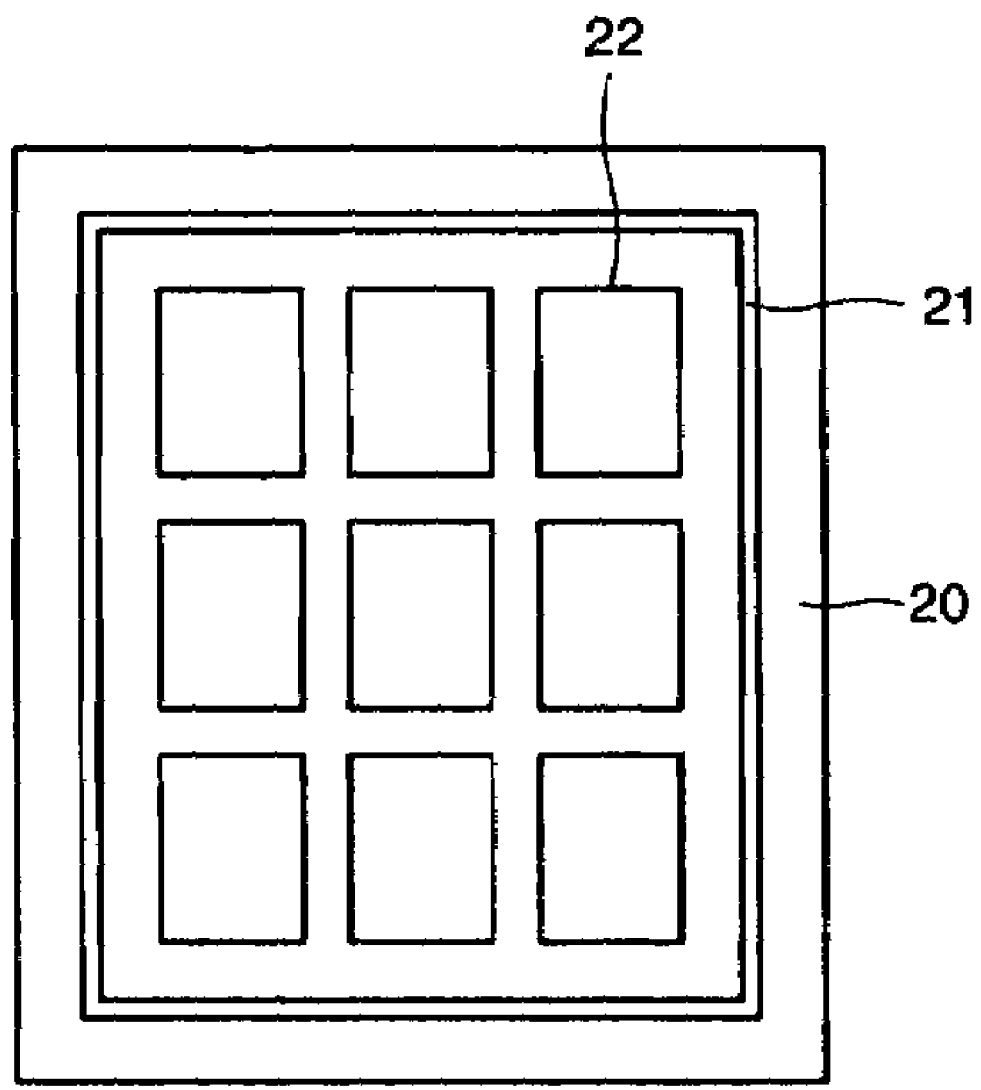
FIG. 2 is a top view illustration of FIG. 1B in which a sealant and glass frits are applied to a sealing member.

In one embodiment, the glass frits 22 are applied to correspond to portions enclosing the light emitting units 11, and the sealant 21 is applied to enclose all of the glass frits 22. The pattern of the glass frits 22 and the sealant 21 of this embodiment is shown in FIG. 2.

The sealant may be either a UV hardening sealant or a thermal hardening sealant.

Figure 1C:
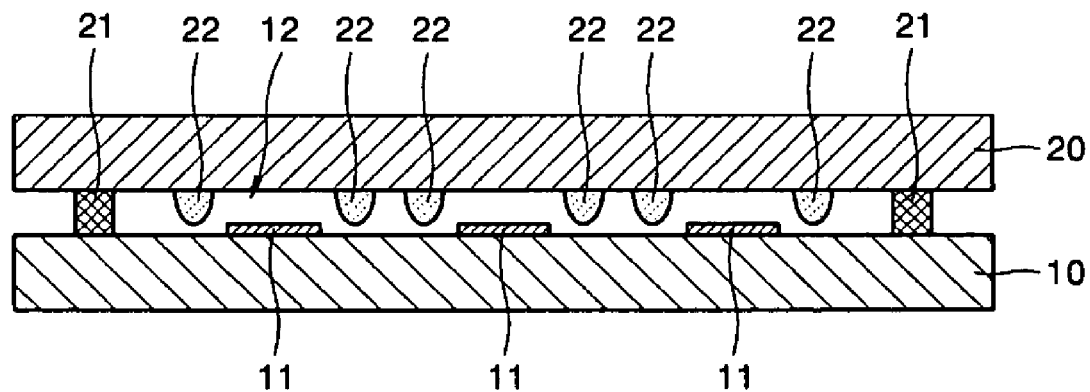

After the glass frits 22 and the sealant 21 are applied to the sealing member 20, the sealing member 20 is assembled with the substrate 10 (shown in FIG. 1A) such that the sealant 21 is combined with the substrate 10, as illustrated in FIG. 1C.

The assembly process is performed under a vacuum atmosphere at a predetermined vacuum level. Thus, a space 12 between the substrate 10 and the sealing member 20 has the same vacuum level as the vacuum level at which the assembly process is performed. The vacuum atmosphere formed in the space 12 allows the substrate 10 and the sealing member 20 to closely contact each other such that the glass frits 22 can be hardened. In this case, the vacuum level in the space 12 is acceptable so long as pressure in the space 12 is below atmospheric pressure.

The combining process using the sealant 21 may be performed under a nitrogen gas atmosphere. In one embodiment, it is desirable that this process be performed at a pressure lower than atmospheric pressure.

Figure 1D:
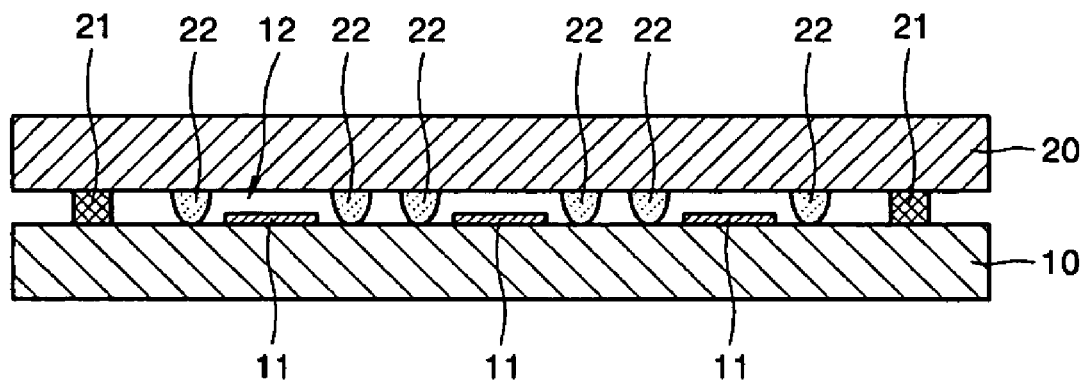

After the sealing member 20 is assembled with the substrate 10, the sealant 21 is hardened by irradiation with ultraviolet light. In one embodiment, when the sealant 21 is completely hardened, as illustrated in FIG. 1D, the surfaces of the glass frits 22 may touch the substrate 10. However, in another embodiment, the surfaces of the glass frits 22 may not necessarily contact the substrate 10, and may be a predetermined distance apart from the substrate 10. At a point later in the assembly process, when the substrate 20 and the sealing member 20 adhered by the sealant 21 are exposed to atmospheric pressure, the surfaces of the glass frits 22 may touch the substrate due to the pressure difference between the space 12 formed between the substrate 10 and the sealing member 20 and the outside of the substrate 10.

The glass frits 22 whose surfaces touch the substrate 10 are partially hardened. Therefore, the substrate 10 is combined with the sealing member 20 via the glass frits 22, which are melted and then hardened again.

The glass frits 22 are melted by laser. The melted glass frits 22 can be combined with the substrate 10 only when the surfaces of the glass frits 22 touch the substrate 10. To this end, the sealing member 20 and the substrate 10 should be in close proximity to each other, and conventionally, an additional instrument such as a clamp or the like is used for this.

In one embodiment, in order to improve the conventional sealing method using the glass frits, first the substrate 10 and the sealing member 20 are temporarily combined with each other via the sealant 21 under a vacuum atmosphere. Then, the substrate 10 and the sealing member 20 are exposed to atmospheric pressure to harden the glass frits 22. After being exposed to atmospheric pressure, the substrate 10 and the sealing member 20 form a sealed package.

As described above, and shown in FIG. 1D, when the substrate 10 and the sealing member 20 are exposed to atmospheric pressure after the sealant 21 is completely hardened, the substrate 10 and the sealing member 20 more closely contact each other due to the difference between the pressure in the space 12 between the substrate 10 and the sealing member 20 and the atmospheric pressure. As a result, the surfaces of the glass frits 22 more fully contact the substrate 10. Therefore, allowing for shrinkage of the sealant 21 during hardening, and due at least in part to the difference between the pressure in the space 12 between the substrate 10 and the sealing member 20 and the atmospheric pressure outside of the space 12, the thickness of glass frits 22 and the thickness of the sealant 21 can be appropriately selected. The selection is to make the space between the substrate 10 and the sealing member 20 shrink when the sealant 21 is completely hardened and the substrate 10 and the sealing member 20 are exposed to atmospheric pressure so that the surfaces of the glass frits 22 touch the substrate 10, as shown in FIG. 1D.

In a state where the substrate 10 and the sealing member 20 closely contact each other at the positions of the glass frits, a laser is directed to parts of the glass frits 22. The glass frits 22 are thus melted and will adhere to the substrate 10. At this moment, when the glass frits 22 are hardened, the substrate 10 and the sealing member 20 are strongly bound to each other via the glass frits 22. Then, a panel of a flat panel display device is obtained in which the sealant 21 is disposed on a perimeter that bounds the glass frits 22.

Embodiments of flat panel display device may be obtained if there is a pressure difference between the space 12 defined between the substrate 10 and the sealing member 20 and atmospheric pressure outside of the space 12. In one embodiment, it is preferable that the pressure at which the sealant 21 is hardened be lower than the pressure in which the glass frits 22 are hardened.

Hence, in another embodiment, the process of hardening the glass frits 22 may not necessarily be performed at atmospheric pressure, but rather performed at any pressure to about atmospheric pressure and higher than the pressure at which the sealant 21 was hardened. In yet another embodiment, if the glass frits 22 are hardened at atmospheric pressure, the sealant 21 may be hardened at a high pressure, where the high pressure is sufficient to harden the sealant 21 at a pressure within a pressure range from about several millimeters of mercury (the torr or millimeter of mercury (mmHg) is a non-SI unit of pressure.) up to about atmospheric pressure.

Figure 1E:
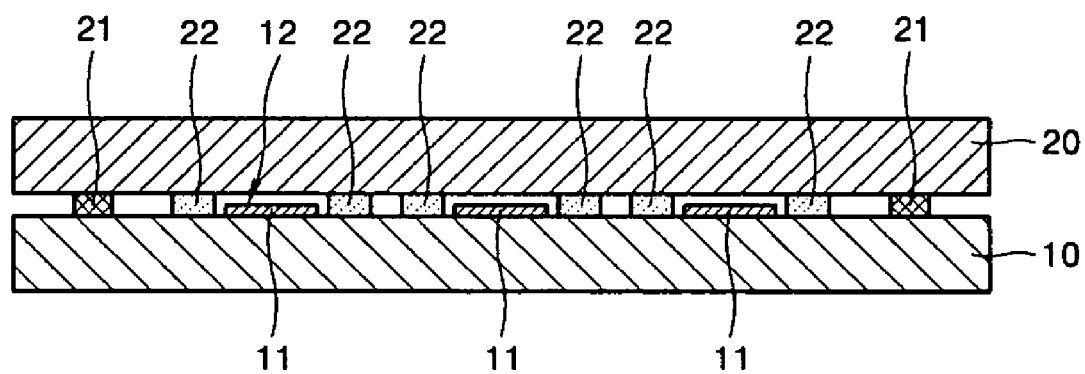
Figure 1F:
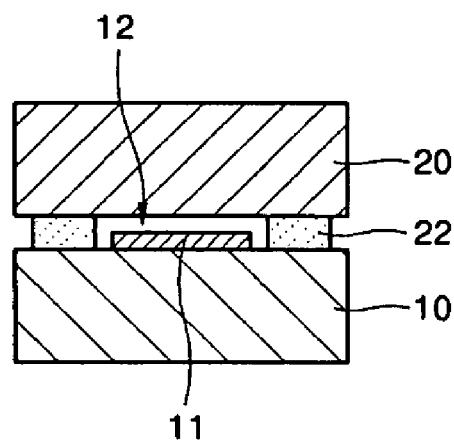

The panel, as illustrated in FIG. 1E, can be divided into individual units of the light emitting unit 11 as illustrated in FIG. 1F. A flat panel display device can be obtained by adding predetermined electronic devices to the unit panel. A pressure in the inner space 12 of the individual unit panel maintains the pressure at which the sealant 21 is hardened and is below the atmospheric pressure.

The substrate 10 and the sealing member 20 are temporarily combined with each other via the sealant 21 under a vacuum atmosphere and then combined via the glass frits 22 under the atmospheric pressure. As the result, a glass frit sealing structure with a high sealing effect can be obtained via simple processes.

Particularly, since a laser device for melting the glass frits 22 is not necessarily disposed in the chamber for maintaining the nitrogen atmosphere or the vacuum atmosphere, the device can be simple and an additional supporting member for closely contacting the substrate 10 and the sealing member 20 is not required.

Moreover, a primary sealing is performed using the sealant 21 in a vacuum state and then the glass frits 22 disposed inside of the sealant 21 are used to thoroughly seal the substrate 10 and the sealing member 20. Thus, the light emitting unit 11 can be entirely separated from the external environment. Therefore, an additional desiccant is not required.

Figure 3A:
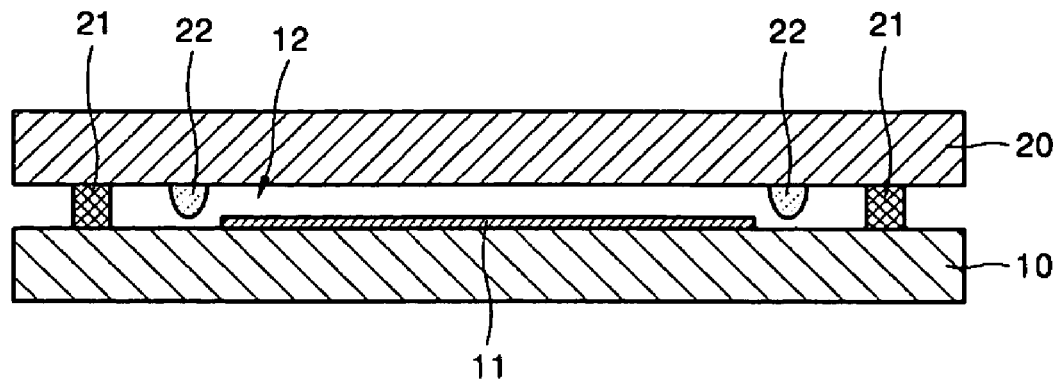
FIGS. 3A through 3C are cross-sectional diagrams illustrating certain steps of a method of manufacturing a flat panel display device, according to another embodiment of the present invention.
Figure 3B:
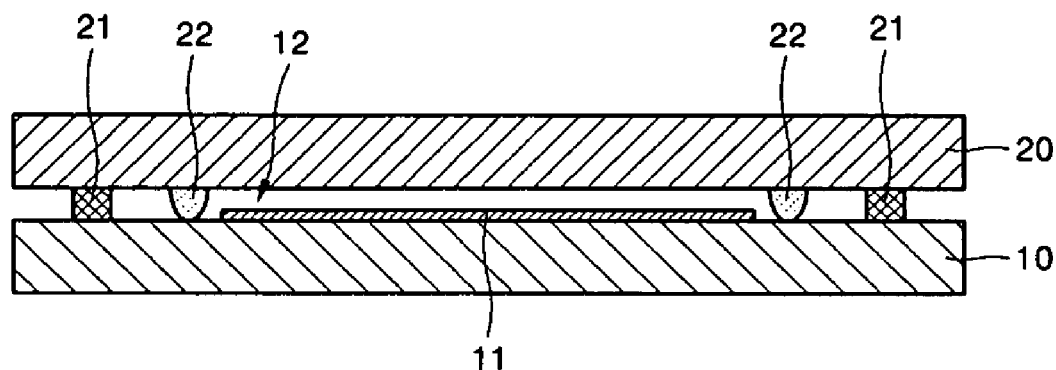
Figure 3C:
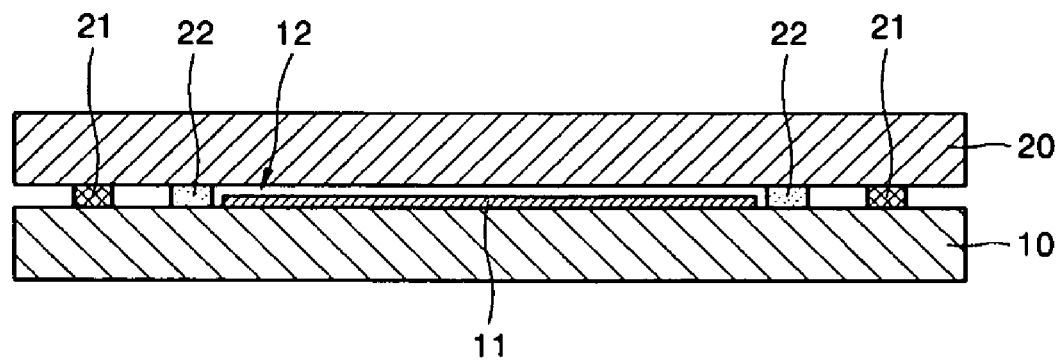

The above manufacturing method may be used when a plurality of light emitting units 11 are formed on the substrate 10 as illustrated in FIGS. 1A through 1F, as well as when a single light emitting unit are formed on the substrate 10 as illustrated in FIGS. 3A through 3C.

As shown in FIG. 3A, a glass frit 22 is applied to a portion of the sealing member 20 which is opposite to and covers the light emitting unit 11, and the sealant 21 is applied to enclose the glass frit 22.

Subsequently, the substrate 10 is combined with the sealing member 20 by contacting the sealant 21 and the substrate 10 at a predetermined vacuum level. In addition, in this state, ultra-violet light is irradiated to the sealant 21 to harden the sealant 21.

The combining process using the sealant 21 may be performed under a nitrogen atmosphere as described above. In this case, it is desirable that the combining process is performed at a pressure lower than the atmospheric pressure for a glass frit hardening process, but the pressure for the combining process is not limited thereto.

Next, when the substrate 10 and the sealing member 20 are exposed to atmospheric pressure or a pressure higher than the pressure at which the sealant 21 is hardened, the substrate 10 and the sealing member 20 are close to each other as illustrated in FIG. 3B, and thus the surface of the glass frit 22 touches the substrate 10.

In this state, the glass frit 22 is melted by laser and subsequently hardened so that the substrate 10 and the sealing member 20 are sealed by the glass frit 22 as illustrated in FIG. 3C. A pressure in the space 12 between the substrate 10 and the sealing member 20 is maintained below the atmospheric pressure or a pressure outside of the space 12 at which the glass frit 22 is hardened, and a sealing structure is formed on the outer side of the glass frit 22 by the sealant 21, as illustrated in FIG. 3C.

In the flat panel display device according to embodiment shown in FIGS. 3A through 3C, the sealant 21 primarily seals up the space 12, and then the glass frit 22 secondarily seals up the space 12, and therefore, a good sealing effect may be achieved without an additional desiccant. Thus, the life span of the flat panel display device can be increased.

In the flat panel display device according to another embodiment, the sealant 21 may remain as it is or a part of the sealant 21 may be cut out to reduce the thickness thereof.

The present invention as described above is not limited to an organic light emitting display deice, and may be applied to another flat panel display panel such as a liquid crystal display device, an inorganic electroluminescence display device, or the like.

As described above, certain embodiments of a flat panel display device provide the following effects.

First, since a substrate and a sealing member are primarily combined with each other using a sealant and secondarily combined with each other using a glass frit at atmospheric pressure, a glass frit sealing structure having a high sealing effect can be easily implemented.

Second, since a laser instrument for melting a glass frit does not have to be installed in a chamber for maintaining a nitrogen atmosphere or a vacuum atmosphere, the structure of the flat panel display device is simplified and a supporting member for closely contacting the substrate and the sealing member is not required.

Third, since primary sealing is performed using the sealant in a state where the substrate and the sealing member are not exposed to air and then complete sealing is performed using the glass frit disposed inwardly of the sealant, a light emitting unit can be totally separated from an external environment. Therefore, the addition of a desiccant is not required.

Fourth, the life span of the flat panel display device can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a flat panel display device, the method comprising:
    forming at least one light emitting unit on a surface of a substrate, the light emitting unit including a plurality of light emitting elements;
    providing a sealing member to be placed opposite to the surface of the substrate;
    applying a glass frit to an opposing surface of either the substrate or the sealing member to enclose the light emitting unit;
    applying a sealant to the opposing surface of either the substrate or the sealing member to enclose the glass frit;
    combining the substrate and the sealing member via the sealant at a first pressure, wherein the substrate and the sealing member are not combined via the glass frit while at the first pressure; and
    subsequent to combining the substrate and the sealing member via the sealant, combining the substrate and the sealing member via the glass frit, wherein combining the substrate and the sealing member via the glass frit is performed at a second pressure higher than the first pressure.

2. The method of claim 1, further comprising applying the glass frit to a first thickness as measured perpendicular to the substrate, and applying the sealant to a second thickness as measured perpendicular to the substrate, the first thickness being less than the second thickness.

3. The method of claim 1, wherein the combining via the sealant is performed under a vacuum atmosphere at a predetermined vacuum level, and the combining via the glass frit is performed at atmospheric pressure.

4. The method of claim 1, further comprising:
    assembling the sealing member and the substrate at a predetermined vacuum atmosphere; and
    hardening the sealant.

5. The method of claim 1, wherein the combining via the glass frit comprises melting the glass frit and hardening the glass frit at the second pressure higher than the first pressure at which the combining via the sealant is performed.

6. The method of claim 5, wherein melting the glass frit comprises melting by laser.

7. The method of claim 6, wherein the combining via the glass frit is performed at atmospheric pressure.

8. The method of claim 1, wherein the sealant is an ultraviolet hardening sealant.

9. The method of claim 1, further comprising:
    forming a plurality of light emitting units on the substrate; and
    applying the glass frit to positions on the sealing member so as to separately enclose each of the light emitting units.

10. The method of claim 1, further comprising:
    forming a plurality of light emitting units on the substrate; and
    applying the sealant to a position on the sealing member so as to enclose the light emitting units.

11. The method of claim 1, wherein the light emitting elements arc organic light emitting elements.

12. A method of manufacturing a flat panel display device, the method comprising:
    forming at least one light emitting unit on a surface of a substrate, the light emitting unit including a plurality of light emitting elements;
    providing a sealing member to be placed opposite to the surface of the substrate;
    applying a glass frit to an opposing surface of either the substrate or the sealing member to enclose the light emitting unit;
    applying a sealant to the opposing surface of either the substrate or the sealing member to enclose the glass frit;
    combining the substrate and the sealing member via the sealant under a nitrogen gas atmosphere at a first pressure, wherein the substrate and the sealing member are not combined via the glass frit while at the first pressure; and
    subsequent to combining the substrate and the sealing member via the sealant, combining the substrate and the sealing member via the glass frit under atmospheric pressure, the first pressure being less than the atmospheric pressure.

13. The method of claim 12, further comprising applying the glass frit to a first thickness as measured perpendicular to the substrate, and applying the sealant to a second thickness as measured perpendicular to the substrate, the first thickness being less than the second thickness.

14. The method of claim 12, further comprising:
    assembling the sealing member and the substrate under a nitrogen gas atmosphere; and
    hardening the sealant.

15. The method of claim 12, wherein the combining via the glass frit comprises melting the glass frit and hardening the glass frit at the atmospheric pressure higher than the first pressure at which the combining via the sealant is performed.

16. The method of claim 15, wherein the glass frit is melted by laser.

17. The method of claim 12, wherein the sealant is an ultra-violet hardening sealant.

18. The method of claim 12, further comprising:
 forming a plurality of light emitting units on the substrate; and
 applying the glass frit to positions on the sealing member so as to separately enclose each of the light emitting units.

19. The method of claim 12, further comprising:
 forming a plurality of light emitting units on the substrate; and
 applying the sealant to a position on the sealing member so as to enclose the light emitting units.

20. The method of claim 12, wherein the light emitting elements are organic light emitting elements.

* * * * *

UNITED STATES PATENT AND TRADEMARK OFFICE
CERTIFICATE OF CORRECTION

PATENT NO. : 7,431,628 B2 Page 1 of 1
APPLICATION NO. : 11/282210
DATED : October 7, 2008
INVENTOR(S) : Park et al.

It is certified that error appears in the above-identified patent and that said Letters Patent is hereby corrected as shown below:

| Column | Line | Description of Error |
|---|---|---|
| Item (56) Page 2 Col. 2 | 8 | Under Foreign Patent Documents, below "2003-123966" delete "JP 2003-243160 8/2003". |
| Item (56) Page 2 Col. 2 | 10 | Under Foreign Patent Documents, change "8/2004" to --8/2005--. |
| 8 | 28 (Approx.) | In Claim 11, change "arc" to --are--. |

Signed and Sealed this

Fourteenth Day of April, 2009

JOHN DOLL
*Acting Director of the United States Patent and Trademark Office*